United States Patent [19]
Noble

[11] Patent Number: 5,987,196
[45] Date of Patent: Nov. 16, 1999

[54] SEMICONDUCTOR STRUCTURE HAVING AN OPTICAL SIGNAL PATH IN A SUBSTRATE AND METHOD FOR FORMING THE SAME

[75] Inventor: Wendell P. Noble, Milton, Vt.

[73] Assignee: Micron Technology, Inc., Boise, Id.

[21] Appl. No.: 08/965,143

[22] Filed: Nov. 6, 1997

[51] Int. Cl.[6] .............................. G02B 6/12; H01L 21/70; G11C 5/06

[52] U.S. Cl. ................................ 385/14; 385/15; 385/24; 385/27; 385/42; 385/131; 385/132; 437/51; 365/64; 365/72

[58] Field of Search .................................. 385/14, 15, 24, 385/27, 31, 39, 42, 43, 49, 50, 88, 89, 131, 132; 437/129, 51; 365/64, 72, 215, 234

[56] References Cited

U.S. PATENT DOCUMENTS

| | | | |
|---|---|---|---|
| 3,765,969 | 10/1973 | Kragness et al. ......................... 156/17 |
| 4,015,893 | 4/1977 | Sugano et al. ......................... 385/14 X |
| 4,652,077 | 3/1987 | Erman et al. ......................... 385/14 X |
| 4,755,015 | 7/1988 | Uno et al. .............................. 385/14 X |
| 4,820,655 | 4/1989 | Noda et al. ............................... 437/129 |
| 4,966,430 | 10/1990 | Weidel ................... 385/14 X |
| 4,999,686 | 3/1991 | Autier et al. ......................... 385/14 X |
| 5,159,700 | 10/1992 | Reid et al. ................................. 385/14 |
| 5,170,448 | 12/1992 | Ackley et al. ........................... 385/31 |
| 5,280,189 | 1/1994 | Schüppert et al. ..................... 257/458 |
| 5,360,982 | 11/1994 | Venhuizen .................................. 385/14 |
| 5,371,818 | 12/1994 | Presby ..................................... 385/49 |
| 5,394,490 | 2/1995 | Kato et al. ................................. 385/14 |
| 5,452,383 | 9/1995 | Takiguchi ................................. 385/16 |
| 5,481,629 | 1/1996 | Tabuchi .................................... 385/14 |
| 5,485,021 | 1/1996 | Abe ........................................... 257/84 |
| 5,488,678 | 1/1996 | Taneya et al. ............................ 385/14 |
| 5,502,779 | 3/1996 | Magel ......................................... 385/1 |
| 5,513,285 | 4/1996 | Kawashima et al. ..................... 385/16 |
| 5,513,288 | 4/1996 | Mayer ........................................ 385/30 |
| 5,519,803 | 5/1996 | Shiono et al. ........................... 385/132 |
| 5,521,994 | 5/1996 | Takeuchi et al. ......................... 385/14 |
| 5,523,557 | 6/1996 | Bruno ................................... 250/214.1 |
| 5,526,454 | 6/1996 | Mayer ....................................... 385/49 |
| 5,534,442 | 7/1996 | Parker et al. ............................... 437/2 |
| 5,546,489 | 8/1996 | Sasaki et al. ............................. 385/88 |
| 5,559,914 | 9/1996 | Asakura .................................... 385/49 |
| 5,574,806 | 11/1996 | Kragl et al. ............................... 385/14 |
| 5,577,138 | 11/1996 | Chandrasekhar et al. ................ 385/14 |
| 5,577,139 | 11/1996 | Chandrasekhar ......................... 385/14 |
| 5,598,490 | 1/1997 | Hakogi et al. ............................ 385/14 |
| 5,600,741 | 2/1997 | Hauer et al. .............................. 385/35 |
| 5,602,672 | 2/1997 | Ishimura et al. ........................ 359/245 |
| 5,604,835 | 2/1997 | Nakamura et al. ..................... 385/129 |
| 5,611,008 | 3/1997 | Yap ........................................... 385/14 |
| 5,621,828 | 4/1997 | Baets et al. ............................... 385/14 |
| 5,696,862 | 12/1997 | Hauer et al. .............................. 385/88 |
| 5,701,374 | 12/1997 | Makiuchi .................................. 385/49 |
| 5,835,646 | 11/1998 | Yoshimura et al. ...................... 385/14 |
| 5,848,214 | 12/1998 | Haas et al. ............................ 385/14 X |
| 5,883,988 | 3/1999 | Yamamoto et al. ...................... 385/14 |

OTHER PUBLICATIONS

Hunt, Charles E. et al., "Electrical and Physical Properties of Rapid–Zone–Recrystallized SOI Made Using a Pulsed Arc Lamp," *Abstracts of the 18th (1986 International) Conference on Solid State Devices and Materials*, Tokyo, Japan, 1986, pp. 561–565.

Lu, N.C.C. et al., "A Buried–Trench DRAM Cell Using a Self–Aligned Epitaxy Over Trench Technology," *IEDM Digest of Technical Papers*, 1998, pp. 588–591.

Ishiwara, H. et al., "Selective Doping of P Atoms in Lateral Solid Phase Epitaxy of Si Films," *Extended Abstracts of the 18th (1986 International) Conference on Solid State Devices and Materials*, Tokyo, Japan, 1986, pp. 553–556.

*Primary Examiner*—Brian Healy
*Attorney, Agent, or Firm*—Seed and Berry LLP

[57] ABSTRACT

A semiconductor layer is disposed on an opaque substrate, and first and second circuits are respectively disposed in the semiconductor layer or in the substrate. An optical signal path is disposed in the substrate beneath the semiconductor layer and is coupled to the first and second circuits.

79 Claims, 10 Drawing Sheets

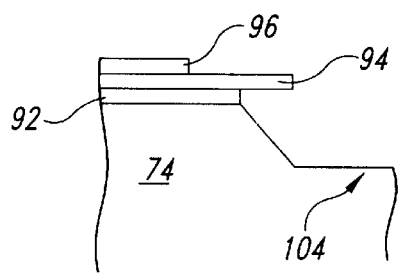
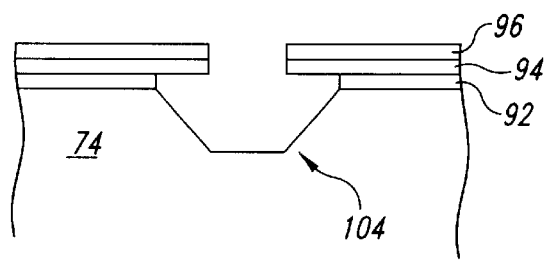
Fig. 13A　　　　　Fig. 13B
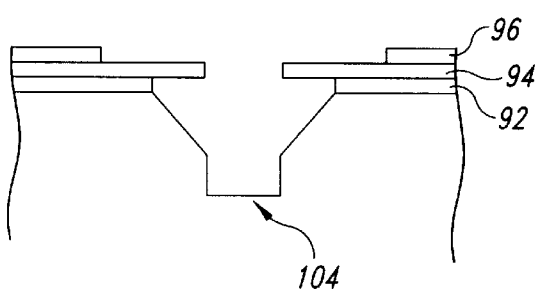
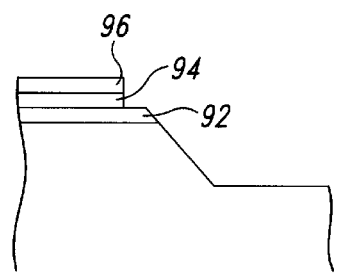
Fig. 14　　　　　Fig. 15
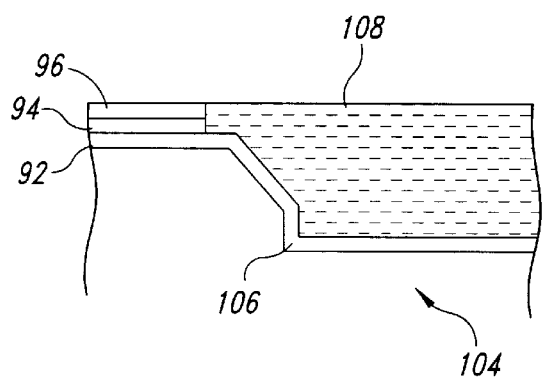
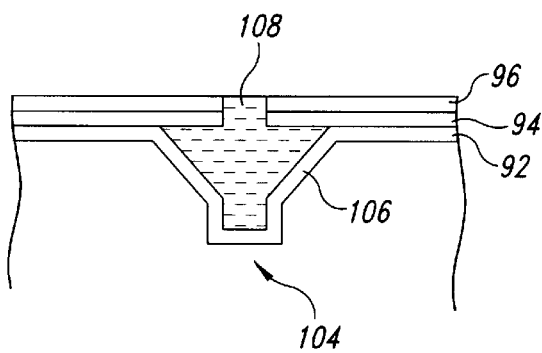
Fig. 16A　　　　　Fig. 16B

SEMICONDUCTOR STRUCTURE HAVING AN OPTICAL SIGNAL PATH IN A SUBSTRATE AND METHOD FOR FORMING THE SAME

TECHNICAL FIELD

The invention relates generally to integrated circuits, and more specifically to an integrated circuit having an optical signal path disposed in the substrate.

BACKGROUND OF THE INVENTION

Due to layout and routing considerations in today's densely structured integrated circuits, it is sometimes required that a signal be routed from one location on an integrated-circuit die to another relatively distant location on the same die. Typically, this is accomplished by an electrical conductor that is routed between the two locations.

A problem with using an electrical conductor is that as the number of components in, and thus the size of, an integrated circuit increases to provide more functionality such as increased processing power and memory storage, the conductor often becomes longer, and thus the signal delay introduced by the conductor becomes greater. Therefore, the size of the integrated circuit may be restrained by the maximum delay that can be tolerated for such a routed signal, or additional circuitry may be needed to accommodate for the delay.

One technique for reducing the signal delay is to route the signals via an optical path or waveguide instead of an electrical conductor. For example, U.S. Pat. No. 5,485,021 discloses a semiconductor device that includes a transparent substrate, a thin semiconductor film disposed on the substrate, and circuitry formed in the thin film, where optical signals are routed through the transparent substrate. But a problem with the '021 technique is that there are many types of circuits and circuit components that are difficult or impractical to form in a thin film. Furthermore, the transparent substrate is a relatively lossy optical path. Therefore, an optical signal must have a power that is high enough overcome the losses introduced by the substrate. Because of the present trend towards reducing the power consumption of integrated circuits, having to generate such a relatively high-powered optical signal would often be undesirable.

Another example of an optical-routing technique is found in U.S. Pat. No. 5,604,835, which discloses optical waveguides that are disposed along the sidewalls of a substrate trench. But a problem with the '835 technique is that, because the waveguides are formed along the trench sidewalls, the trench must be relatively wide. Therefore, because circuitry can be disposed only in the substrate regions that are between the trenches, the area of the integrated circuit often must be increased by the relatively large area that the trenches occupy.

SUMMARY OF THE INVENTION

In accordance with one aspect of the invention, a semiconductor structure includes an opaque substrate. A semiconductor layer is disposed on the substrate, and first and second circuits are respectively disposed in the semiconductor layer or in the substrate. An optical signal path is disposed in the substrate beneath the semiconductor layer and is coupled to the first and second circuits.

Because it is formed in an opaque substrate, such an optical path is less lossy than many conventional optical paths. Furthermore, because circuitry can be disposed under or over the optical path, the optical path causes little or no increase in the area of an integrated circuit.

BRIEF DESCRIPTION OF THE DRAWINGS

FIG. 13A is a cross-sectional view taken along lines A–A' of FIG. 12 at a fourth point in the method.

FIG. 13B is a cross-sectional view taken along lines B–B' of FIG. 12 at the fourth point in the method.

FIG. 14 is a cross-sectional view taken along lines B–B' of FIG. 12 at a fifth point in the method.

FIG. 15 is a cross-sectional view taken along lines A–A' of FIG. 12 at the fifth point in the method.

FIG. 16A is a cross-sectional view taken along lines A–A' of FIG. 12 at a sixth point in the method.

FIG. 16B is a cross-sectional view taken along lines B–B' at the sixth point in the method.

DETAILED DESCRIPTION OF THE INVENTION

Figure 1:
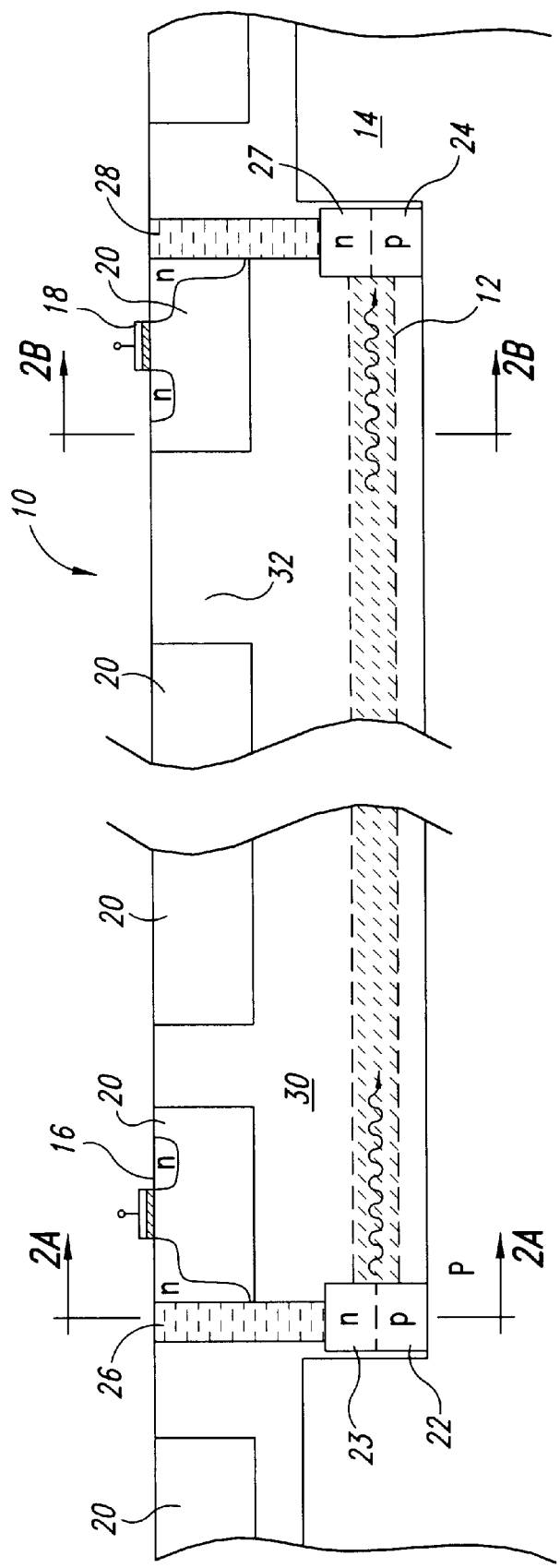
FIG. 1 is a side cross-sectional view of a semiconductor structure according to a first embodiment of the invention.

FIG. 1 is a side cross-sectional view of one embodiment of a semiconductor structure 10, which is part of an integrated circuit such as a memory device. The structure 10 includes an optical waveguide, i.e., optical path, 12, which is formed in a substrate 14. In one embodiment of the invention, the substrate 14 is formed from a semiconductor material such as silicon. First and second circuits 16 and 18 are formed in a semiconductor layer 20, which is disposed on the substrate 14. In one embodiment, the circuits 16 and 18 include respective transistors, and the layer 20 is an epitaxial layer of silicon. Optical-to-electrical couplers 22 and 24 are electrically insulated from the substrate by sidewalls 25 and 27, respectively, and couple the first and second circuits 16 and 18 to the optical path 12 via electrical conductors 26 and 28, respectively. In one embodiment, the couplers 22 and 24 comprise respective diodes that act as either or both a photodiode and a light-emitting diode, as discussed below. An insulator layer 30 is disposed between the substrate 14 and the layer 20, and isolation regions 32 may extend through the layer 20 to the insulator layer 30. In such in an embodiment, the layer 30 and the regions 32 merge to provide a silicon-on-insulator (SOI) structure that includes electrically isolated islands of the semiconductor layer 20 where circuitry can be formed. In another embodiment, where the substrate 14 is made from a semiconductor material, one or both of the first and second circuits 16 and 18 may be formed in the substrate 14. In yet another embodiment, one or both of the circuits 16 and 18 can respectively have a portion formed in the substrate 14 and a portion formed in the semiconductor layer 20.

Figure 2A:
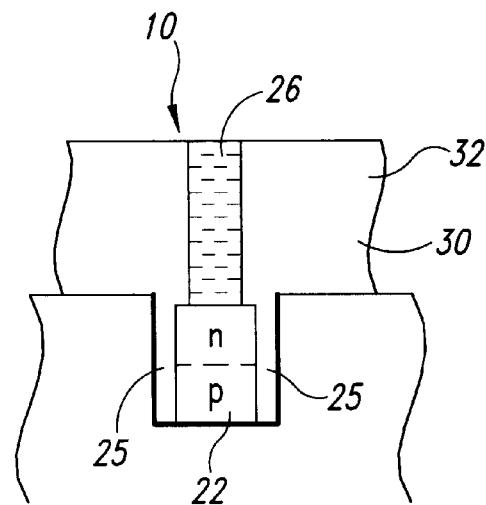
FIG. 2A is a cross-sectional view taken along the line A–A' of FIG. 1.
Figure 2B:
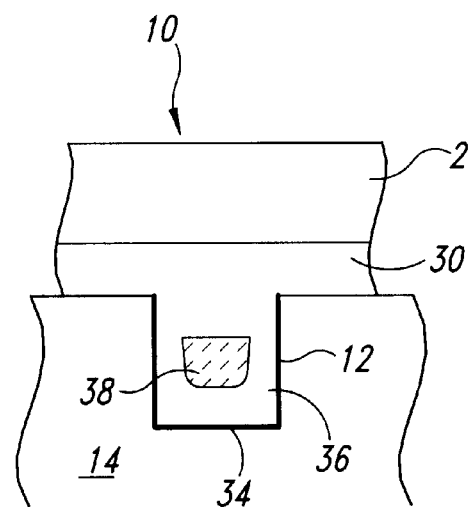
FIG. 2B is a cross-sectional view taken along the line B–B' of FIG. 1.

FIG. 2A is a cross-sectional view of the semiconductor structure 10 taken along lines A–A' of FIG. 1. FIG. 2B is a cross-sectional view of the semiconductor structure 10 taken along lines B–B' of FIG. 1. With reference to FIG. 2B, the optical path 12 includes a reflective outer shell 34, which reduces leakage of the optical signal into the substrate 14. In one embodiment, the shell 34 is a thin layer of a refractory metal such as tungsten. The optical path 12 also includes a cladding 36 and a core 38, which is surrounded by the cladding 36. In one embodiment, the insulator layer 30 and the cladding 36 include an oxide and thus merge to form a continuous region, and the core 38 includes phosphorous-doped silicon glass (PSG). Because the cladding 36 and the core 38 have sufficiently different indexes of refraction, the optical waves are contained within the path 12 with little or no leakage. Furthermore, as discussed above, the reflective properties of the shell 34 serve to further reduce such losses.

Referring to FIGS. 1 and 2A–2B, it is known that a diode, such as the diodes 22 and 24, will luminesce when biased to operate in an avalanche mode (light-emitting diode). It is also known that the luminescing efficiency can be improved if the junction of the diode is doped n+/p+ and is abrupt. Furthermore, it is known that a reverse-biased diode has a dark current in the femtoamp (fA) range, but that when exposed to light, the current through the reverse-biased diode increases by many orders of magnitude (photodiode).

Therefore, in operation, the diodes 22 and 24 are each respectively biased as either a photodiode or a light-emitting diode, depending upon the direction of the signal propagation. For example purposes, the operation will be discussed when the circuit 16 generates a signal that is to be received by the circuit 18.

First, the circuit 16 generates an electrical signal that modulates the luminescence of, and thus the optical signal generated by, the diode 22, which is biased to operate as a light-emitting diode. In one embodiment, the substrate 14 is biased at a negative voltage, for example between −1V and −3V, such that a relatively low-voltage signal from the circuit 16 can cause the diode 22 to luminesce. Furthermore, biasing the substrate 14 at a negative voltage may also lower the diode-junction breakdown voltage through its gating effect on the n+/p+ junction. To enhance this effect, the sidewalls 25 and 27 can be made thinner, for as the thickness of the sidewall decreases, the gating effect increases. Alternatively, the substrate 14 may be biased at ground, and the circuit 16 generates a higher-voltage signal.

Next, the diode 24, which is reverse-biased to operate as a photodiode, receives the optical signal and modulates a current in response thereto. The circuit 18 then converts the modulated current into the voltage signal that was transmitted by the circuit 16.

The transmission speed of the optical signal depends on the photoemission efficiency of the light-emitting diode 22 (or 24, depending upon the direction of transmission), the transmission efficiency of the optical path 12, and the detection efficiency of the photo diode 24 (or 22). The emission and detection efficiencies of the diodes 22 and 24 can be conventionally adjusted to suit the particular application. Furthermore, the transmission losses that occur in the path 12 are a geometric function of the path length. Therefore, the relatively short length of the path 12, as compared to the lengths of conventional fiber optic cables, serves to significantly limit the transmission losses. Additionally, different varieties of materials can be used for the shell 34, cladding 36, and core 38 to conventionally adjust the transmission characteristics of the optical path 12.

Because circuitry, such as the circuits 16 and 18, can be disposed over the trenches 42 and 44, the trenches do not significantly reduce the amount of die area available for building circuits. Thus, the optical paths 12 take up very little, if any, extra die area. Furthermore, because each path 12 is separated from other paths 12 by the regions of the opaque substrate 14, there is little if any cross-talk between or losses that occur in the optical paths 12. The reflective shell 34 also aids in reducing cross-talk and losses by reflecting incident optical energy back into the path 12.

FIGS. 3–8 are cross-sectional views that illustrate one embodiment of a method for forming the semiconductor structure 10 of FIGS. 1–2B.

Figure 3:
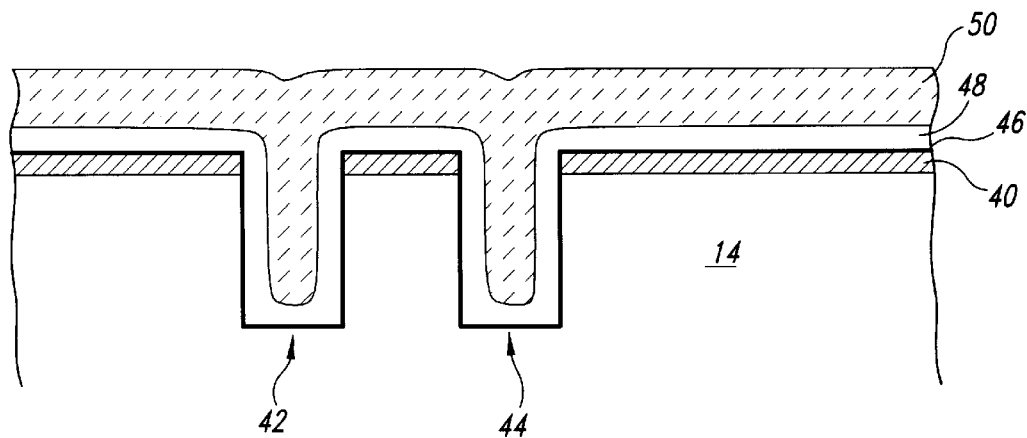
FIG. 3 is a cross-sectional view at a first point in one embodiment of a method for forming the semiconductor structure of FIG. 1.

Referring to FIG. 3, a conventional oxide-nitride pad structure 40 is formed on the substrate 14. Next, the pad 40 is conventionally masked and etched to remove the portions of the pad 40 that are over the regions of the substrate 14 where the optical paths 12 are to be formed. Then, the exposed regions of the substrate 14 are etched to form trenches 42 and 44, which in one embodiment have depths of approximately 0.4 microns ($\mu$m) below the substrate 14 surface. For clarity, only two trenches are shown, it being understood that there may be more or fewer trenches.

Next, a layer 46 of a refractory metal is conventionally deposited by chemical-vapor deposition (CVD) to line the trenches 42 and 44. In one embodiment, the layer 46 includes tungsten, and is approximately 10 nanometers (nm) thick.

Then, an insulator layer 48 is conventionally CVD deposited on the layer 46. The portions of the layer 48 that are within the trenches 42 and 44 will form portions of the cladding 36 (FIG. 2B). In one embodiment, the layer 48 includes silicon dioxide and is approximately 60 nm thick.

Next, a layer 50 of phosphorous-doped silicon glass (PSG) is conventionally CVD deposited on the layer 48 to fill the trenches 42 and 44. Portions of the layer 50 that are in the trenches 42 and 44 will be used to form the core 38 (FIG. 2B). The specific characteristics of the PSG layer 50, such as the doping level, can be conventionally varied to tailor the light-transmission characteristics of the optical paths 12 (FIG. 1).

Then, the PSG layer 50 and the insulator layer 48 are conventionally chemically and mechanically polished (CMP) back to the layer 46, which acts as a polish stop. In other embodiments, the layers 48 and 50 may be removed by other conventional means such as etching.

Next, the layer 46 is anisotropically etched until only the portions that line the trenches 42 and 44 remain. These remaining portions of the layer 46 form the outer shells 34 of the respective optical paths 12 (FIG. 2B).

Figure 4:
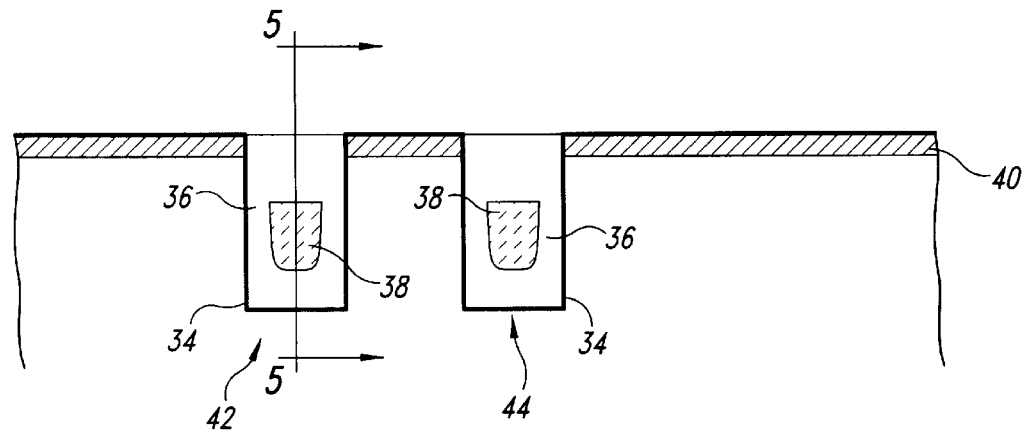
FIG. 4 is a cross-sectional view at a second point in the method.

Referring to FIG. 4, the PSG layer 50 is conventionally recessed in the trenches 42 and 44 to form the respective cores 38. In one embodiment, the layer 50 is etched to a depth of approximately 80 nm below the substrate surface. Depending upon the selectivity of the etch chemistry that is used, the remaining portions of the layer 48 in the trenches 42 and 44 may also be removed to the same or a lesser depth to form portions of the respective cladding regions 36.

Still referring to FIG. 4, an insulator layer is conventionally CVD deposited to fill the trenches 42 and 44. The layer is then conventionally removed from the pad structure 40 to form the remaining portions of the cladding regions 36. In one embodiment, the layer includes silicon dioxide and is conventionally polished back to the pad structure 40.

Figure 5:
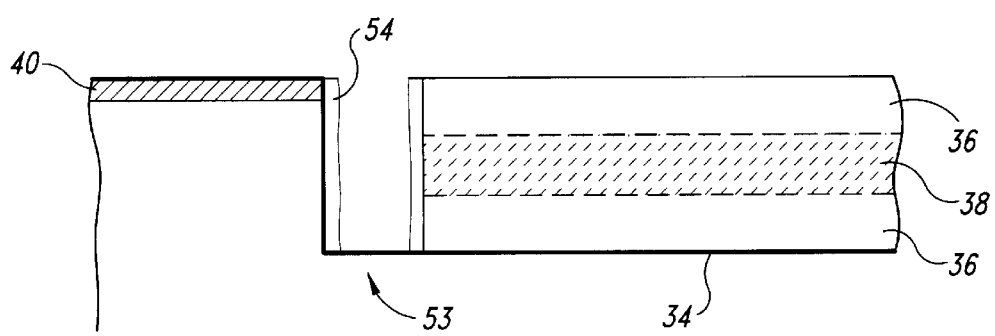
FIG. 5 is a cross-sectional view taken along lines C–C' of FIG. 4 at a third point in the method.
Figure 6:
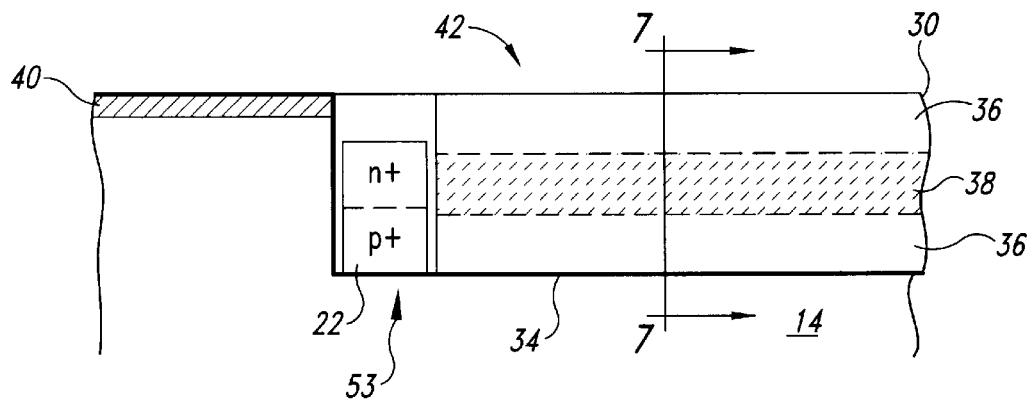
FIG. 6 is a cross-sectional view taken at a fourth point in the method.

FIGS. 5 and 6 are cross-sectional views of the trench 42 taken along lines C–C' of FIG. 4. Although only trench 42 is shown for clarity, it is understood that process for the trench 44 proceeds in a similar manner.

Referring to FIG. 5, a mask (not shown) is conventionally formed on the pad structure 40 and over the trench 42. The mask exposes regions 53 of the trench 42 where the diodes 22 and 24 (FIG. 1) are to be formed. In one embodiment, the exposed regions 53 are the end regions of the trench 42. For clarity, only one such region 53 is shown in FIGS. 5 and 6.

Next, the cladding 36 and the core 38 are anisotropically etched back to the shell 34 in the exposed regions 53 of the trench 42.

Then, the exposed portions of the shell 34 in the regions 53 are anisotropically etched so that the portions on the trench bottom are removed and the portions on the trench 42 sidewalls remain.

After the removal of the mask, an insulating layer 54 is conventionally formed to line the bottom and sidewalls of the exposed trench regions. In one embodiment, the layer 54 includes silicon dioxide that is conventionally CVD deposited to a thickness of approximately 10 nm or less.

Then, the layer 54 is anisotropically etched so that the portions on the trench bottom are removed and the portions along the trench sidewalls remain. The structure is now as shown in FIG. 5.

Referring to FIG. 6, epitaxial p+ silicon is then conventionally grown from the exposed regions of the substrate 14 at the bottom of the trench 42 until it fills the trench openings. Thus, the exposed substrate regions act as seed regions for the epitaxial silicon. In one embodiment, the doping concentration of the epitaxial silicon is conventionally graded from approximately $10^{19}$ atoms/cm$^3$ at the trench bottom to approximately $10^{17}$ atoms/cm$^3$ at the trench top. The lower doping concentration at the top facilitates the n-type counter doping of the epitaxial silicon to form the diode 22 as discussed below.

Then, the epitaxial silicon is conventionally polished or otherwise removed back to the pad structure 40.

Next, the epitaxial silicon is conventionally recessed below the surface of the substrate 14, in one embodiment to a depth of approximately 100 nm.

Then, using the pad structure 40 as a mask, the recessed epitaxial silicon is implanted with an n-type dopant to form the n+/p+ diode 22. In one embodiment, the n+ region has a doping concentration of approximately $10^{19}$ atoms/cm$^3$.

Next, the insulator layer 30 is conventionally formed to fill the trench and to form an insulator cap on the diode 22. In one embodiment, the layer 30 includes silicon dioxide that is conventionally CVD deposited and polished back to the pad 40. Thus, the layer 30 merges with the cladding 36 to form an approximately continuous cladding-insulator region.

Figure 7:
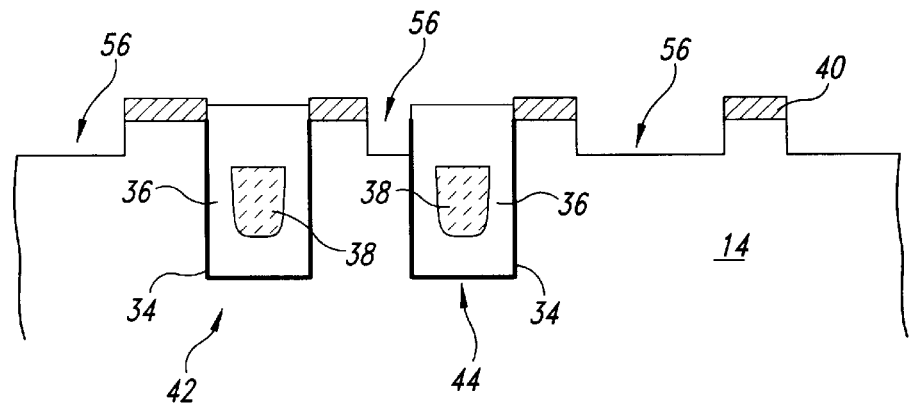
FIG. 7 is a cross-sectional view taken along lines D–D' at a fifth point in the method.
Figure 8:
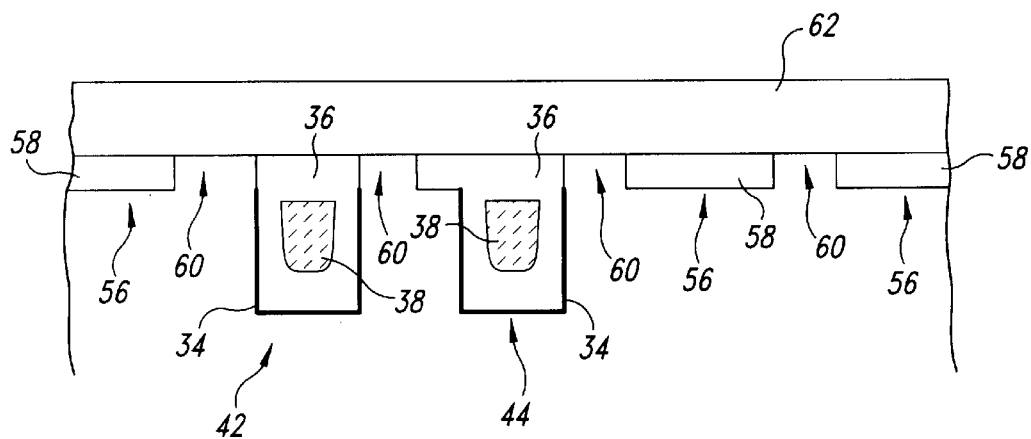
FIG. 8 is a cross-sectional view taken at a sixth point in the method.

FIGS. 7 and 8 are cross-sectional views taken along lines D–D' of FIG. 6.

Referring to FIG. 7, the regions of the pad 40 that are aligned with the active areas to be later formed in the layer 20 (FIG. 1) are conventionally removed. In one embodiment, the pad 40 is conventionally masked and the exposed regions are etched away.

Then, the exposed regions of the substrate 14 are conventionally recessed to form regions 56. In one embodiment, the regions 56 are conventionally etched to a depth of approximately 200 nm below the substrate 14 surface.

Referring to FIG. 8, an insulator layer 58 is conventionally formed to fill in the recessed regions 56 and to fill any remaining discontinuities in the trenches 42 and 44. In one embodiment, the layer 58 includes silicon dioxide that is conventionally CVD deposited and polished back to the remaining regions of the pad 40.

Then, the pad 40 is conventionally removed to expose portions 60 of the substrate 14 that are between the insulator-filled regions 56 and the trenches 42 and 44.

Next, using the regions 60 as seed regions, an epitaxial silicon layer 62 is grown to a thickness that is sufficient for the layer 62 to completely cover the regions 60, the insulator-filled regions 56, and the trenches 42 and 44. In one embodiment, the layer 62 is grown to a thickness of approximately 0.5 $\mu$m. This thickness is sufficient where the widths of the regions 56 and the trenches 42 and 44, and the combined widths of any regions 56 and trenches 42 or 44 that are contiguous, are 0.4 $\mu$m or less.

Then, the layer 62 is conventionally polished to provide a planar surface for subsequent conventional device processing.

Next, the isolation regions 32 (FIG. 1) may be conventionally formed, such as by conventional silicon trench isolation (STI), to define the electrically isolated regions 20 (FIG. 1) of the layer 62. Conventional techniques may then be used to form the conductors 26 and 28 (FIG. 1).

Figure 9:
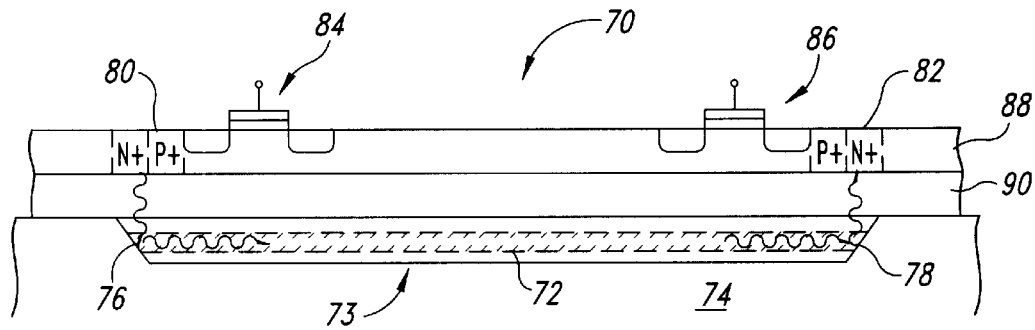
FIG. 9 is a side cross-sectional view of a semiconductor structure according to a second embodiment of the invention.

FIG. 9 is a cross-sectional view of a semiconductor structure 70 according to a second embodiment of the invention. An optical path 72, which is similar to the optical path 12 of FIG. 1, is disposed in a trench 73 of a substrate 74. The path 72 includes reflectors 76 and 78 for deflecting optical signals to and from diodes 80 and 82, which are similar to the diodes 22 and 24 of FIG. 1 and which are coupled to or form part of circuits 84 and 86, respectively. The circuits 84 and 86 are disposed in a semiconductor layer 88, which is disposed on an insulator layer 90. In one embodiment, the layer 90 is transparent to allow optical communication between the reflectors 76 and 78 and the diodes 80 and 82, respectively. In another embodiment, the layer 90 is opaque, and optical pathways are disposed in the layer 90 to allow such optical communication. Furthermore, in an embodiment where the substrate 74 is made from a semiconductor material, one or both of the circuits 84 an 86 may be disposed in the substrate 74. In yet another embodiment, one or both of the circuits 84 and 86 can respectively have a portion formed in the substrate 74 and a portion formed in the semiconductor layer 88. In all other aspects, the structure 70 operates similarly to the structure 10 of FIG. 1.

Although the reflectors 76 and 78 are shown as disposed at the ends of the optical path 72, in another embodiment they are disposed in mid regions of the path 72 and are partially reflective such that each one reflects a portion of the optical signal to a diode and lets another portion of the signal continue propagating along the path 72 to one or more additional reflectors (not shown in FIG. 9). In this way, a single path 72 can optically couple more than two circuits.

Figure 10:
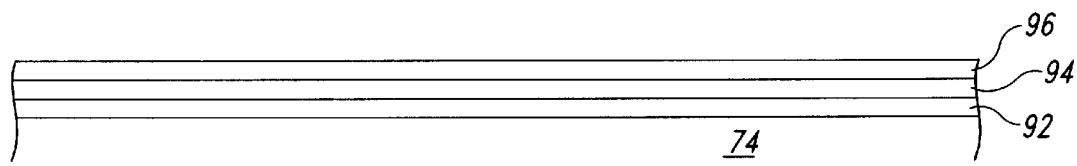
FIG. 10 is a cross-sectional view taken at a first point in one embodiment of a method for forming the semiconductor structure of FIG. 9.
Figure 11:
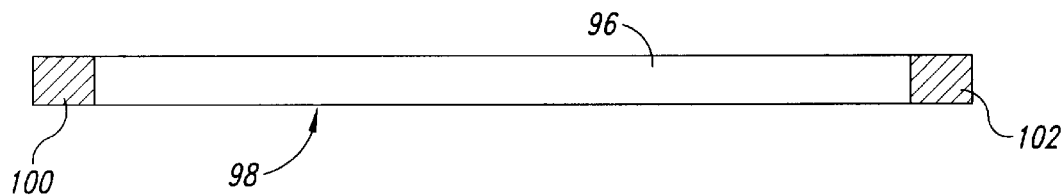
FIG. 11 is a top view taken at a second point in the method.
Figure 12:
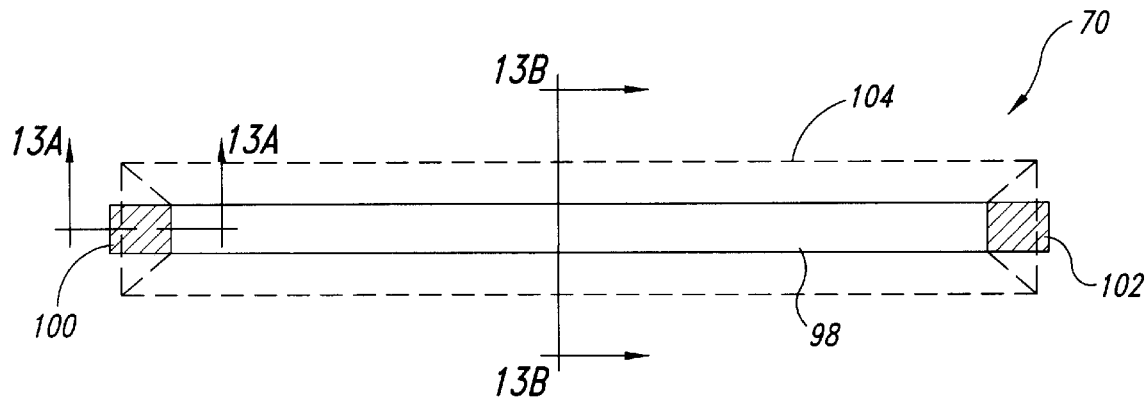
FIG. 12 is a top view taken at a third point in the method.

FIGS. 10 and 13A–21 are cross-sectional side views and FIGS. 11–12 are top views that show one embodiment of a method for forming the structure 70 of FIG. 9.

Referring to FIG. 10, the substrate 74, which in one embodiment is a silicon substrate, has an orientation. For example purposes, the substrate 24 is horizontally oriented such that the substrate surface lies in the <100> plane. A first insulator layer 92 is then conventionally formed on the substrate 74. In one embodiment, the layer 92 includes a pad oxide that is thermally grown to a thickness of approximately 10 nm.

Next, a second insulator layer 94 is conventionally formed on the layer 92. In one embodiment, the layer 94 includes silicon nitride that is conventionally CVD deposited to a thickness of approximately 0.5 μm.

Then, a third insulator layer 96 is conventionally formed on the layer 94. In one embodiment, the layer 96 includes an oxide that is conventionally CVD deposited to a thickness of approximately 0.1 μm.

Referring to FIG. 11, a first mask is formed to expose a region 98 of the layer 96 where the trench 73 is to be formed, and the exposed region 98 of the third insulator layer 96 is conventionally removed. In one embodiment, the width of the region 98 is approximately 3.0 μm, and the length is approximately two minimum images longer than the desired length of the optical path 72, one minimum image longer on each end.

Next, a second mask (not shown in FIG. 11) is formed to cover the ends 100 and 102 of the region 98. The uncovered regions of the layers 92 and 94 within the region 98 are then conventionally removed to expose the substrate 74, but the layers 92 and 94 are not removed in the regions 100 and 102. Next, both the first and second masks are removed.

Referring to FIG. 12 and 13A–13B, which are cross-sectional views taken along lines A–A' and B–B', respectively, of FIG. 12, the exposed region of the substrate 74 is subjected to a conventional orientation-dependent etch (ODE) to bring out the 45° planes (with respect to the substrate surface) in the exposed region of the substrate 74. Thus, in the embodiment where the substrate surface lies in the <100> plane, the ODE brings out the <110> planes.

Conventional ODE etchants are formulated to reveal one of the planes of the silicon crystal lattice. Thus, where revealing a plane requires the breaking of one molecular bond, a weaker ODE etchant is used, and where revealing a plane requires the breaking of multiple molecular bonds, a stronger ODE etchant is used, the etchant strength being dependent upon the number of bonds that must be broken to reveal the desired plane. ODE etching is further discussed in U.S. Pat. No. 3,765,969, entitled "Precision Etching of Semiconductors," which is incorporated by reference.

Still referring to FIGS. 12 and 13A–13B, the ODE is continued until a trench 104 is formed to a desired depth, which in one embodiment is approximately equal to the width of the region 98. The trench 104 has sloped sides and ends that lie in respective <110> planes. The trench sides undercut both the layers 94 and 96, and the trench ends undercut only the layer 94. Furthermore, because the sloped sides and ends are formed by an ODE, they are crystallographic surfaces, i.e., surfaces that are atomically flat or substantially atomically flat. The exposed portions of the layer 92 above the trench 104 may be removed by the ODE or may be removed in a separate etching step that is performed sometime after the ODE.

Referring to FIG. 14, which is a cross-sectional view taken along lines B–B' of FIG. 12, the bottom of the trench 104 is anisotropically etched a desired depth, which in one embodiment is approximately 1 μm, below the bottoms of the sloped sides and ends.

Referring to FIG. 15, which is a cross-sectional view taken along lines A–A' of FIG. 12, the exposed regions of the layer 94 that overhang the ends of the trench 104 (FIG. 13A) are directionally etched while the layer 96 acts as a mask to prevent etching of the unexposed regions of the layer 94.

Referring to FIGS. 16A–16B, which are cross-sectional views taken along lines A–A' and B–B', respectively, of FIG. 12, an insulator layer 106 is formed to line the trench 104. In one embodiment, the layer 106 includes an oxide that is thermally grown to a thickness of approximately 10 nm.

Next, a layer 108 is formed to fill the trench 104. In one embodiment, the layer 108 includes polysilicon that is conventionally CVD deposited and then conventionally polished back to the surface of the layer 96.

Figure 17A:
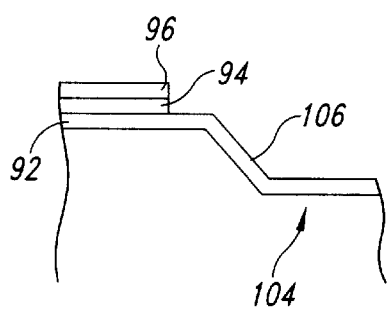
FIG. 17A is a cross-sectional view taken along lines A–A' of FIG. 12 at a seventh point in the method.
Figure 17B:
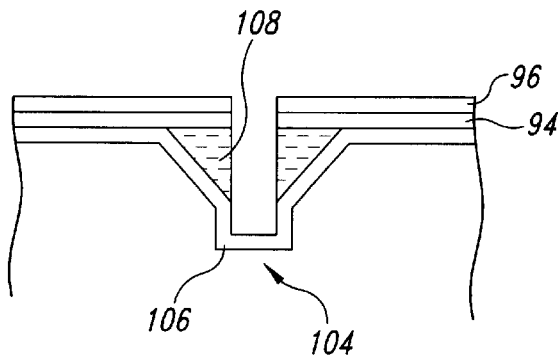
FIG. 17B is a cross-sectional view taken along lines B–B' at the seventh point in the method.

Referring to FIGS. 17A–17B, which are cross-sectional views taken along A–A' and B–B', respectively, of FIG. 12, using the layer 106 as an etch stop, a conventional anisotropic etch removes the regions of the layer 108 from the bottom and ends of the trench 104, but leaves the regions of the layer 108 that are one the sloped trench sides beneath the layer 94.

In another embodiment, the layer 108 is not deposited, and thus the regions over the sloped sides of the trench 104 are not filled with an opaque material. In such an embodiment, these unfilled regions will eventually be filled with the optical material that will form the optical path 72. But an advantage of filling these regions with the opaque layer 108 is that the optical path 72 may be less lossy.

Figure 18:
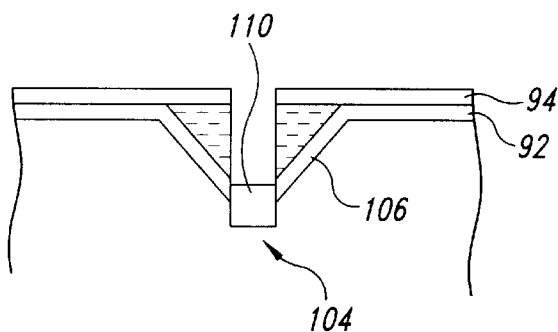
FIG. 18 is a cross-sectional view taken along lines B–B' of FIG. 12 at an eighth point in the method.

Referring to FIG. 18, which is a cross-sectional view taken along lines B–B' of FIG. 12, the bottom of the trench 104 is filled with a layer 110. In one embodiment, the layer 110 includes oxide that is conventionally CVD deposited and then is conventionally polished back to the layer 94. In an embodiment where the layer 96 has not been previously removed, the polishing also removes the layer 96.

Next, the remaining regions of the layer 110 are conventionally recessed a predetermined amount. In one embodiment, the layer 110 is etched back with a timed etch to a thickness of approximately 1 μm at the bottom of the trench 104.

Figure 19:
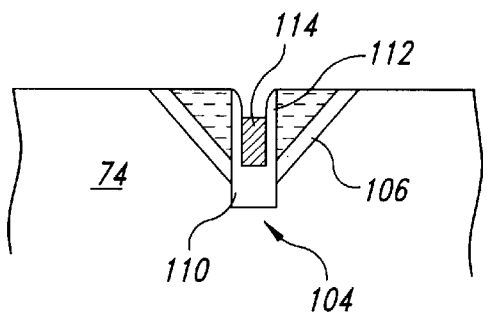
FIG. 19 is a cross-sectional view taken along lines B–B' of FIG. 12 at a ninth point in the method.

Referring to FIG. 19, which is a cross-sectional view taken along lines B–B' of FIG. 12, an insulator layer 112 is conventionally formed to line the vertical side walls of the trench 104. In one embodiment, the layer 112 includes an oxide that is conventionally CVD deposited and then is conventionally anisotropically etched. The remaining portions of the layer 112 and the layer 110 merge to form portions of the cladding 113 (FIG. 20) of the optical path 72. In another embodiment, the etch of the layer 112 is timed to prevent removal of the layer 110 from the bottom of the trench 104.

Next, as also shown in FIG. 19, a layer 114 is formed to fill the trench 104. In one embodiment, the layer 114 includes a phosphorous-doped glass that is doped with approximately 10% phosphorous and that is conventionally CVD deposited and then conventionally polished back to the layer 94.

Then, the layer 114 is recessed to form a core 115, and the layers 92 and 94 are removed. In one embodiment where the layer 94 includes a nitride pad, the layer 114 is conventionally recess etched approximately 1.5 μm below the surface of the substrate 74, the layer 94 is conventionally stripped with phosphoric acid or another etchant, and the layer 92 is conventionally removed.

Figure 20:
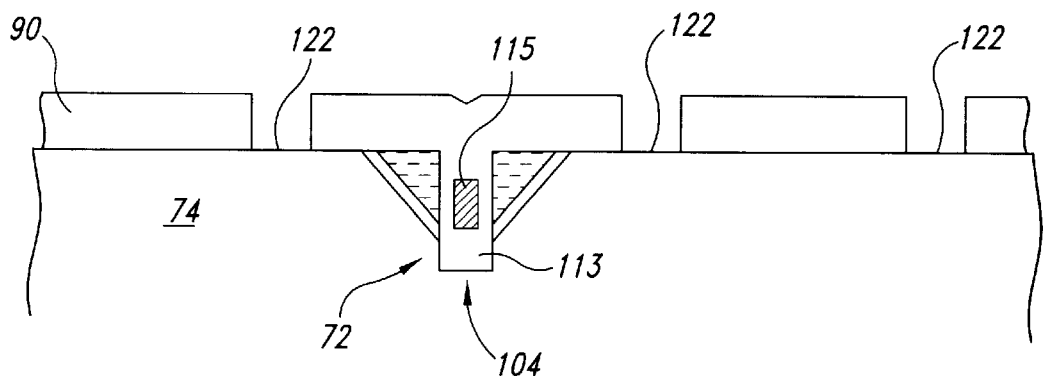
FIG. 20 is a cross-sectional view taken along lines B–B' at a tenth point in the method.

Referring to FIG. 20, the insulator layer 90 (FIG. 9) is formed to fill in the recessed portion of the trench 104 and thus merge with the layer 112 to form the remaining regions of the cladding 113, and to cover the surface of the substrate 74. In one embodiment, the layer 90 includes an oxide that is conventionally CVD deposited to a thickness of approximately 1 μm.

Next, regions of the layer 90 are conventionally removed to expose regions 122 of the substrate 74. In one embodiment, regions of the layer 90 remain over the ends of the trench 104 to form optical paths between the reflectors 76 and 78 and the diodes 80 and 82, respectively (FIG. 9). Furthermore, a region of the layer 90 may remain over the entire optical path 72 to allow the formation of other circuits thereover.

Figure 21:
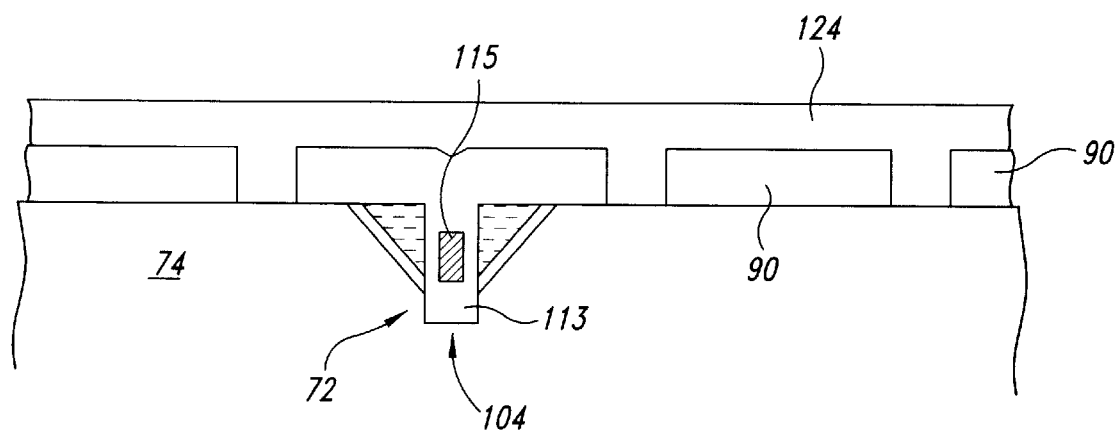
FIG. 21 is a cross-sectional view taken along lines B–B' of FIG. 12 at an eleventh point in the method.

Referring to FIG. 21, a semiconductor layer 124 is formed on the substrate 74 and on the remaining portions of the layer 90. In one embodiment, using the exposed regions 122 as seed regions, the layer 124 includes an epitaxial silicon layer that is grown to a thickness of approximately 1 μm from the surface of the layer 90. An SOI structure can then be formed in a manner similar to that discussed above in conjunction with FIG. 8.

Furthermore, referring again to FIG. 9, the diodes 80 and 82 are formed in a manner similar to that described above in conjunction with FIGS. 1–8 for the diodes 22 and 24, except that the diodes 80 and 82 are oriented parallel to the substrate 74 surface so that the p+/n+ junctions can receive and transmit optical signals to and from the respective reflectors 76 and 78, which reflect optical signals between the optical path 72 and the diodes 80 and 82, respectively.

In embodiments where the layer 90 is transparent, the optical signals easily propagate therethrough between the respective reflectors 76 and 78 and the diodes 80 and 82, respectively. Although a transparent layer 90 may cause some losses, it is typically thin enough such that these losses will be negligible. In embodiments where the layer 90 is opaque, vias are formed and filled with a transparent material to allow optical transmission between the respective reflectors 76 and 78 and the diodes 80 and 82.

Figure 22:
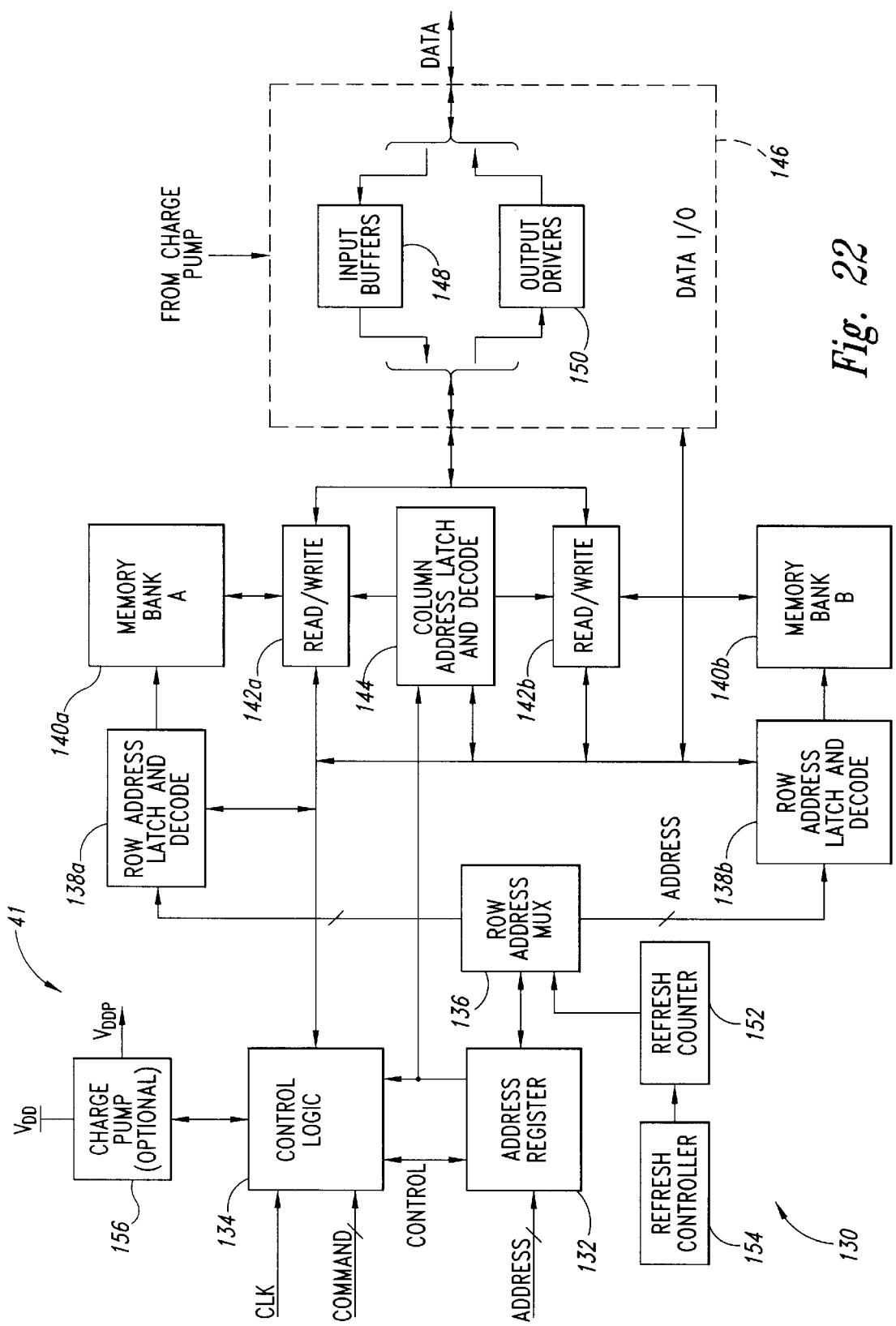
FIG. 22 is a block diagram of a memory device that incorporates one or both of the semiconductor structures of FIGS. 1 and 9, respectively.

FIG. 22 is a block diagram of a memory circuit 130, which can include one or both of the semiconductor structures 10 and 70 of FIGS. 1 and 9, respectively.

The memory circuit 130 includes and address register 132, which receives and address from an ADDRESS bus. A control logic circuit 134 receives a clock (CLK) signal, and receives clock enable (CKE), chip select ($\overline{CS}$), row address strobe ($\overline{RAS}$), column address strobe ($\overline{CAS}$), and write enable ($\overline{WE}$) signals from the COMMAND bus, and communicates with the other circuits of the memory device 130. A row address multiplexer 136 receives the address signal from the address register 132 and provides the row address to the row-address latch-and-decode circuits 138a and 138b for the memory bank 140a or 140b, respectively. During read and write cycles, the row-address latch-and-decode circuits 138a and 138b activate the word lines of the addressed rows of memory cells in the memory banks 140a and 140b, respectively. Read/write circuits 142a and 142b read data from the addressed memory cells in the memory banks 140a and 140b, respectively, during a read cycle, and write data to the addressed memory cells during a write cycle. A column-address latch-and-decode circuit 144 receives the address from the address register 132 and provides the column address of the selected memory cells to the read/write circuits 142a and 142b. For clarity, the address register 132, the row-address multiplexer 136, the row-address latch-and-decode circuits 138a and 138b, and the column-address latch-and-decode circuit 144 can be collectively referred to as an address decoder.

A data input/output (I/O) circuit 146 includes a plurality of input buffers 148. During a write cycle, the buffers 148 receive and store data from the DATA bus, and the read/write circuits 142a and 142b provide the stored data to the memory banks 140a and 140b, respectively. The data I/O circuit 146 also includes a plurality of output drivers 150. During a read cycle, the read/write circuits 142a and 142b provide data from the memory banks 140a and 140b, respectively, to the drivers 150, which in turn provide this data to the DATA bus.

A refresh counter 152 stores the address of the row of memory cells to be refreshed either during a conventional auto-refresh mode or self-refresh mode. After the row is refreshed, a refresh controller 154 updates the address in the refresh counter 152, typically by either incrementing or decrementing the contents of the refresh counter 152 by one. Although shown separately, the refresh controller 154 may be part of the control logic 134 in other embodiments of the memory device 130.

The memory device 130 may also include an optional charge pump 156, which steps up the power-supply voltage $V_{DD}$ to a voltage $V_{DDP}$. In one embodiment, the pump 156 generates $V_{DDP}$ approximately 1–1.5 V higher than $V_{DD}$. The memory circuit 130 may also use $V_{DDP}$ to conventionally overdrive selected internal transistors.

Figure 23:
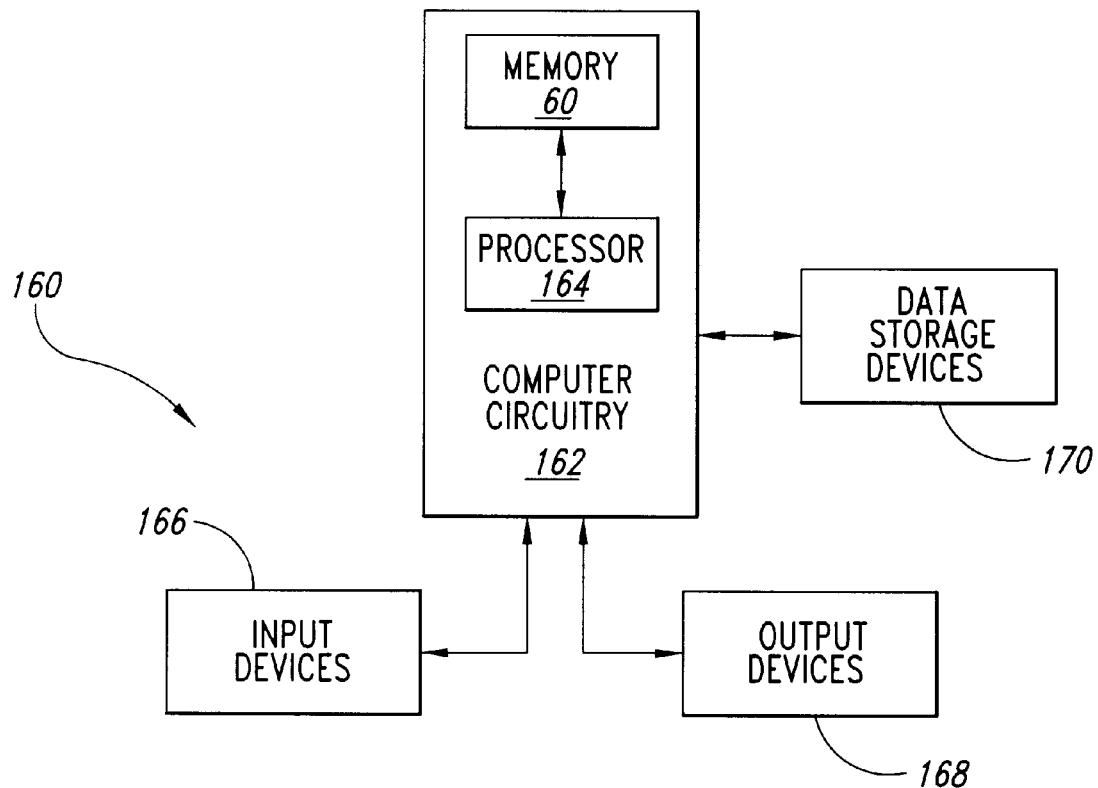
FIG. 23 is a block diagram of an electronic system that incorporates the memory device of FIG. 22.

FIG. 23 is a block diagram of an electronic system 160, such as a computer system, that incorporates the memory circuit 130 of FIG. 22. The system 160 includes computer circuitry 162 for performing computer functions, such as executing software to perform desired calculations and tasks. The circuitry 162 typically includes a processor 164 and the memory circuit 130, which is coupled to the processor 164. One or more input devices 166, such as a keyboard or a mouse, are coupled to the computer circuitry 162 and allow an operator (not shown) to manually input data thereto. One or more output devices 168 are coupled to the computer circuitry 162 to provide to the operator data generated by the computer circuitry 162. Examples of such output devices 168 include a printer and a video display unit. One or more data-storage devices 170 are coupled to the computer circuitry 162 to store data on or retrieve data from external storage media (not shown). Examples of the storage devices 170 and the corresponding storage media include drives that accept hard and floppy disks, tape cassettes, and compact disk read-only memories (CD-ROMs). Typically, the computer circuitry 162 includes address data and command buses and a clock line that are respectively coupled to the ADDRESS, DATA, and COMMAND buses, and the CLK line of the memory device 130.

From the foregoing it will be appreciated that, although specific embodiments of the invention have been described herein for purposes of illustration, various modifications may be made without deviating from the spirit and scope of the invention.

I claim:

1. A semiconductor structure, comprising:
   a semiconductor substrate;
   a semiconductor layer disposed on the substrate, the semiconductor layer having a surface;
   a first circuit disposed in the substrate or the semiconductor layer;
   a second circuit disposed in the substrate or the semiconductor layer; and
   a path disposed in the substrate and underlying the semiconductor layer, the path operable to carry an optical signal between the first and second circuits, the path comprising:
   a first section that is disposed in a plane that is substantially parallel to the surface, that has first and second regions, and that is operable to carry the optical signal between the first and second regions;
   a second section that is substantially perpendicular to the surface, is disposed between the first region of the first section and the first circuit, and that is operable to carry the optical signal between the first region and the first circuit; and
   a third section that is substantially perpendicular to the surface, is disposed between the second region of the first section and the second circuit, and that is operable to carry the optical signal between the second region and the second circuit.

2. A semiconductor structure, comprising:
   a semiconductor substrate;
   a semiconductor layer disposed on the substrate, the semiconductor layer having a surface;
   a first circuit disposed in the substrate or the semiconductor layer, the first circuit being operable to generate a first electrical signal;
   a second circuit disposed in the substrate or the semiconductor layer; and
   a path disposed in the substrate and underlying the semiconductor layer, the path operable to carry an optical signal between the first and second circuits, the path comprising:
   a first section that is disposed in a plane that is substantially parallel to the surface, that has first and second regions, and that is operable to carry the optical signal between the first and second regions,
   a first converter that is disposed in optical communication with the first region of the first section and that is operable to convert the second electrical signal into the optical signal,
   a second converter that is disposed in optical communication with the second region of the first section and that is operable to convert the optical signal carried by the first section into a second electrical signal,
   a second section that is substantially perpendicular to the surface, is disposed between the first converter and the first circuit, and that is operable to carry the first electrical signal between the first converter and the first circuit, and
   a third section that is substantially perpendicular to the surface, is disposed between the second converter and the second circuit, and that is operable to carry the second electrical signal between the second converter and the second circuit.

3. A semiconductor structure, comprising:
   a semiconductor substrate;
   a semiconductor layer disposed on the substrate;
   a first optical path disposed in the substrate and underneath the semiconductor layer, the first optical path having first and second regions;
   circuitry disposed in the semiconductor layer and having first and second circuit portions;
   a first signal path disposed in the semiconductor layer between the first region and the first circuit portion; and
   a second signal path disposed in the semiconductor layer between the second region and the second circuit portion.

4. The semiconductor structure of claim 3, further comprising:
   an optical receiver disposed in the first region of the first optical path;
   an optical transmitter disposed in the second region of the first optical path;
   wherein the first signal path comprises a first conductor that couples the first circuit portion to the optical receiver; and
   wherein the second signal path comprises a second conductor that couples the second circuit portion to the optical transmitter.

5. The semiconductor structure of claim 3 wherein:
   the first region of the first optical path comprises a first end region of the first optical path; and
   the second region of the first optical path comprises a second end region of the first optical path.

6. A semiconductor structure, comprising:
   a semiconductor substrate;
   a semiconductor layer disposed on the substrate;
   a first optical path disposed in the substrate and underneath the semiconductor layer, the first optical path having first and second regions;
   circuitry disposed in the semiconductor layer and having first and second circuit portions;
   a first signal path disposed between the first region and the first circuit portion, the first signal path being disposed in the substrate and in the semiconductor layer; and
   a second signal path disposed between the second region and the second circuit portion, the second signal path being disposed in the substrate and in the semiconductor layer.

7. A semiconductor structure, comprising:
   a substrate;
   a trench disposed in the substrate and having first and second regions;
   a first optically transmissive material disposed in the trench;
   a semiconductor layer disposed on the substrate over the first optically transmissive material;
   first and second circuits disposed in the semiconductor layer;
   a first signal path disposed between the first region and the first circuit;
   a second signal path disposed between the second region and the second circuit;
   an optical receiver disposed in the first circuit;
   an optical transmitter disposed in the second circuit;
   wherein the first region of the trench comprises a first angled surface;

wherein the second region of the trench comprises a second angled surface;

wherein the first signal path comprises a second optically transmissive material that is disposed between the first angled surface and the optical receiver; and wherein the second signal path comprises a third optically transmissive material that is disposed between the second angled surface and the optical transmitter.

8. The semiconductor structure of claim 7, further comprising:

an optical receiver disposed in the first region of the trench;

an optical transmitter disposed in the second region of the trench;

wherein the first signal path comprises a first conductor that couples the first circuit to the optical receiver; and wherein the second signal path comprises a second conductor that couples the second circuit to the optical transmitter.

9. A semiconductor structure, comprising:

a substrate;

a semiconductor layer disposed on the substrate;

a first circuit disposed in the semiconductor layer and operable to generate a first electrical signal;

a second circuit disposed in the semiconductor layer and operable to receive a second electrical signal;

an optical waveguide disposed in the substrate and having first and second regions, the optical waveguide operable to carry the first optical signal from the first region to the second region;

a first diode disposed in the substrate and in optical communication with the first region of the optical waveguide, the first diode operable to convert the first electrical signal into the first optical signal;

a second diode disposed in the substrate and in optical communication with the second region of the optical waveguide, the second diode operable to convert the first optical signal into the second electrical signal;

a first conductor coupled to the first diode and the first circuit and operable to carry the first electrical signal from the first circuit to the first diode; and a second conductor coupled to the second diode and the second circuit and operable to carry the second electrical signal from the second diode to the second circuit.

10. The semiconductor structure of claim 9 wherein the optical waveguide comprises:

a core operable to carry the optical signal; and cladding disposed around the core and operable to substantially confine the optical signal to within the core.

11. The semiconductor structure of claim 9 wherein:

the second circuit is operable to generate a third electrical signal;

the first circuit is operable to receive a fourth electrical signal;

the second conductor is operable to carry the third electrical signal from the second circuit to the second diode;

the second diode is operable to convert the third electrical signal into a second optical signal;

the optical waveguide is operable to carry the second optical signal from the second region to the first region;

the first diode is operable to convert the second optical signal into the fourth electrical signal; and the first conductor is operable to carry the fourth electrical signal from the first diode to the first circuit.

12. A semiconductor structure, comprising:

a substrate;

an optical waveguide disposed in the substrate and having first and second ends;

a first diode disposed in the substrate adjacent to the first end of the optical waveguide;

a second diode disposed in the substrate adjacent to the second end of the optical waveguide;

a semiconductor layer disposed on the substrate;

first and second circuits disposed in the semiconductor layer;

a first conductive path coupled to the first diode and the first circuit; and a second conductive path coupled to the second diode and the second circuit.

13. The semiconductor structure of claim 12 wherein the optical waveguide comprises:

a core; and cladding disposed around the core.

14. The semiconductor structure of claim 12 wherein the optical waveguide comprises:

a core that includes a phosphorous-doped glass; and cladding that is disposed around the core and that includes an oxide.

15. The semiconductor structure of claim 12 wherein:

one of the first and second diodes comprises a photo diode; and another of the first and second diodes comprises a light-emitting diode.

16. The semiconductor structure of claim 12 wherein the first and second diodes can each operate as both a photo diode and a light-emitting diode.

17. The semiconductor structure of claim 12 wherein:

the semiconductor layer comprises first and second isolation regions;

the first signal path is disposed in the first isolation region; and the second signal path is disposed in the second isolation region.

18. The semiconductor structure of claim 12 wherein the first and second circuits each comprise a respective transistor.

19. A semiconductor structure, comprising:

an opaque substrate;

an optical path disposed in the substrate and having first and second path regions;

a semiconductor layer disposed on the substrate and over the optical path;

a first circuit disposed in the semiconductor layer and operable to generate a first optical signal;

a second circuit disposed in the semiconductor layer and operable to receive the first optical signal;

a first optical coupler disposed in optical communication with the first path region and operable to direct the first optical signal from the first circuit to the second region; and a second optical coupler disposed in optical communication with the second path region and operable to direct the first optical signal from the first optical coupler to the second circuit.

20. The semiconductor structure of claim 19 wherein the first and second optical couplers each comprise a respective reflective surface.

21. The semiconductor structure of claim 19 wherein:
the substrate comprises a surface that lies in a <100> plane; and
the first and second optical couplers each comprise a respective reflective surface that lies in a <110> plane.

22. The semiconductor structure of claim 19 wherein:
the substrate comprises silicon and a surface that lies in a <100> plane; and
the first and second optical couplers each comprise a respective reflective silicon surface that is integral with the substrate and that lies in the a <110> plane.

23. The semiconductor structure of claim 19 wherein:
the first circuit is operable to receive a second optical signal;
the second circuit is operable to generate the second optical signal;
the first optical coupler is operable to direct the second optical signal from the second optical coupler to the first circuit; and
the second optical coupler is operable to direct the second optical signal from the second circuit to the first optical coupler.

24. The semiconductor structure of claim 19 wherein:
the first circuit comprises a light-emitting diode; and
the second circuit comprise a photo diode.

25. A semiconductor structure, comprising:
a substrate;
a trench formed in the substrate and having first and second trench regions;
a semiconductor layer disposed on the substrate and over the trench;
a first circuit disposed in the semiconductor layer and operable to generate a first optical signal;
a second circuit disposed in the semiconductor layer and operable to receive the first optical signal;
a first optically transmissive material disposed in the trench and operable to carry the first optical signal from the first trench region to the second trench region;
a first optical coupler disposed in the first trench region and operable to direct the first optical signal from the first circuit to the first optically transmissive material; and
a second optical coupler disposed in the second trench region and operable to direct the first optical signal from the first optically transmissive material to the second circuit.

26. The semiconductor structure of claim 25 wherein the substrate comprises a semiconductor material.

27. The semiconductor structure of claim 25 wherein:
the substrate comprises a surface that lies in a <100> plane; and
the first and second optical couplers each comprise a respective reflective surface that lies in the a <110> plane.

28. The semiconductor structure of claim 25 wherein:
the first circuit is operable to receive a second optical signal;
the second circuit is operable to generate the second optical signal;
the first optically transmissive material is operable to carry the second optical signal from the second trench region to the first trench region;
the first optical coupler is operable to direct the second optical signal from the first optically transmissive material to the first circuit; and
the second optical coupler is operable to direct the second optical signal from the second circuit to the first optically transmissive material.

29. The semiconductor structure of claim 25, further comprising a second optically transmissive material disposed between the first trench region and the first circuit and disposed between the second trench region and tile second circuit.

30. The semiconductor structure of claim 25 wherein:
the first trench region comprises a first end of the trench; and
the second trench region comprises a second end of the trench.

31. A semiconductor structure, comprising:
a semiconductor substrate;
a semiconductor layer disposed on the substrate;
first and second circuits disposed in the semiconductor layer;
a first optical path disposed in the substrate and underlying the semiconductor layer;
a second optical path disposed between the first circuit and the first optical path;
a third optical path disposed between the second circuit and the first optical path;
a first optical coupler disposed between the first and second optical paths; and
second optical coupler disposed between the first and third optical paths.

32. The semiconductor structure of claim 31 wherein:
the first optical coupler is disposed in the substrate at a first end of the first optical path; and
the second optical coupler is disposed in the substrate at a second end of the first optical path.

33. The semiconductor structure of claim 31 wherein:
the first optical coupler is disposed in the substrate at an end of the second optical path; and
the second optical coupler is disposed in the substrate at an end of the third optical path.

34. The semiconductor structure of claim 31 wherein:
the first optical coupler is disposed in the substrate at a common end of the first and second optical paths; and
the second optical coupler is disposed in the substrate at a common end of the first and third optical paths.

35. The semiconductor structure of claim 31 wherein:
the substrate comprises a surface that lies in a <100> plane;
the first optical coupler comprises a reflector that is disposed in the substrate at a common end of the first and second optical paths and that lies in a first <110> plane; and
the second optical coupler comprises a reflector that is disposed in the substrate at a common end of the first and third optical paths and that lies in a second <110> plane.

36. A semiconductor structure, comprising:
a substrate;
a trench formed in the substrate and having first and second trench regions;
a semiconductor layer disposed on the substrate and overlying the trench;
first and second circuits disposed in the semiconductor layer;
a first optically transmissive material disposed in the trench;

a first optical coupler disposed in the first trench region;

a first optical path disposed between the first optical coupler and the first circuit;

a second optical coupler disposed in the second trench region; and a second optical path disposed between the second optical coupler and the second circuit.

37. The semiconductor structure of claim 36, further comprising:

a transparent layer disposed between the substrate and the semiconductor layer; and wherein the first and second optical paths are disposed in the transparent layer.

38. The semiconductor structure of claim 36 wherein the first optically transmissive material comprises:

a cladding; and a core disposed within the cladding.

39. The semiconductor structure of claim 36 wherein:

the first optical coupler is disposed in the substrate at a first end of the first optical path; and the second optical coupler is disposed in the substrate at a second end of the first optical path.

40. The semiconductor structure of claim 36 wherein:

the substrate comprises silicon and a first substrate surface that lies in a <100> plane, a second substrate surface that lies in a first <110> plane, and a third substrate surface that lies in a second <110> plane;

the semiconductor layer is disposed on the first substrate surface;

the first optical coupler comprises the second substrate surface; and the second optical coupler comprises the third substrate surface.

41. The semiconductor structure of claim 36 wherein:

the substrate comprises silicon and a first substrate surface that lies in a <100> plane, a second substrate surface that lies in a first <110> plane, and a third substrate surface that lies in a second <110> plane, the second and third substrate surfaces being substantially atomically flat;

the semiconductor layer is disposed on the first substrate surface;

the first and second trench regions respectively comprise first and second trench ends;

the first optical coupler comprises the second substrate surface; and the second optical coupler comprises the third substrate surface.

42. The semiconductor structure of claim 36 wherein:

the substrate comprises silicon and a first substrate surface that lies in a <100> plane, a second substrate surface that lies in a first <110> plane, and a third substrate surface that lies in a second <110> plane, the second and third substrate surfaces being substantially atomically flat;

the semiconductor layer is disposed on the first substrate surface;

the first and second trench regions respectively comprise first and second trench ends;

the first and second optical paths each comprise an end region that is common with a respective one of the first and second trench ends;

the first optical coupler comprises the second substrate surface; and the second optical coupler comprises the third substrate surface.

43. A memory device, comprising:

a substrate;

a semiconductor layer disposed on the substrate;

one or more other layers disposed on the semiconductor layer;

address, data, and command busses disposed in one of the other or semiconductor layers;

an array of memory cells arranged in rows and columns and disposed in the semiconductor layer;

an address decoder disposed in the semiconductor layer and coupled to the address bus and to the array;

a read/write circuit disposed in the semiconductor layer and coupled to the address decoder and to the array;

a data input/output circuit disposed in the semiconductor layer and coupled to the data bus and to said read/write circuit; and a control circuit disposed in the semiconductor layer and coupled to the command bus, to the address decoder, to the read/write circuit, and to the data input/output circuit; and an optical signal path disposed in the substrate and beneath the semiconductor layer, the optical signal path coupled to at least two of the following portions of the memory device: the address bus, command bus, data bus, array, address decoder, read/write circuit, data input/output circuit, and control circuit.

44. The memory device of claim 43 wherein:

the semiconductor layer comprises a surface; and the optical signal path comprises, a first section having first and second regions and being disposed in a plane that is substantially parallel to the surface, a second section that is substantially perpendicular to the surface and that is disposed between the first region of the first section and a first one of the at least two portions of the memory device, and a third section that is substantially perpendicular to the surface and that is disposed between the second region of the first section and a second one of the at least two portions of the memory device.

45. The memory device of claim 43 wherein:

the semiconductor layer comprises a surface; and the path comprises, an optical conductor that is disposed in a plane that is substantially parallel to the surface and that has first and second regions, an optical-to-electrical converter that is disposed in optical communication with the first region of the optical conductor, an electrical-to-optical converter that is disposed in optical communication with the second region of the first section, a first electrical conductor that is substantially perpendicular to the surface and that is disposed between the optical-to-electrical converter and a first one of the at least two portions of the memory device, and a second electrical conductor that is substantially perpendicular to the surface and that is disposed between the electrical-to-optical converter and a second one of the at least two portions of the memory device.

46. A memory device, comprising:

a substrate;

a semiconductor layer disposed on the substrate;

one or more other layers disposed on the semiconductor layer;

address, data, and command busses disposed in one of the other or semiconductor layers;

an array of memory cells arranged in rows and columns and disposed in the semiconductor layer;

an address decoder disposed in the semiconductor layer and coupled to the address bus and to the array;

a read/write circuit disposed in the semiconductor layer and coupled to the address decoder and to the array;

a data input/output circuit disposed in the semiconductor layer and coupled to the data bus and to said read/write circuit;

a control circuit disposed in the semiconductor layer and coupled to the command bus, to the address decoder, to the read/write circuit, and to the data input/output circuit;

an optical path disposed in the substrate and underlying the semiconductor layer, the optical path having first and second path regions, the optical path operable to carry an optical signal from the first path region to the second path region;

a first optical coupler disposed in optical communication with the first path region and operable to direct the optical signal to the second region from one of the following: the address bus, command bus, data bus, array, address decoder, read/write circuit, data input/output circuit, and control circuit; and a second optical coupler disposed in optical communication with the second path region and operable to direct the optical signal from the first optical coupler to another one of the following: the address bus, command bus, data bus, array, address decoder, read/write circuit, data input/output circuit, and control circuit the second circuit.

47. The memory device of claim 46 wherein:

the substrate comprises silicon and a surface that lies in a <100> plane; and the first and second optical couplers each comprise a respective reflective silicon surface that is integral with the substrate and that lies in a <110> plane.

48. An electronic system, comprising:

a data input device;

a data output device; and computing circuitry coupled to the data input and output devices, the computing circuitry including a memory device that includes, a substrate, a semiconductor layer disposed on the substrate, one or more other layers disposed on the semiconductor layer, address, data, and command busses disposed in one of the other or semiconductor layers, an array of memory cells arranged in rows and columns and disposed in the semiconductor layer, an address decoder disposed in the semiconductor layer and coupled to the address bus and to the array, a read/write circuit disposed in the semiconductor layer and coupled to the address decoder and to the array, a data input/output circuit disposed in the semiconductor layer and coupled to the data bus and to said read/write circuit, a control circuit disposed in the semiconductor layer and coupled to the command bus, to the address decoder, to the read/write circuit, and to the data input/output circuit, and an optical signal path disposed in the substrate and beneath the semiconductor layer, the optical signal path coupled to at least two of the following portions of the memory device: the address bus, command bus, data bus, array, address decoder, read/write circuit, data input/output circuit, and control circuit.

49. The electronic system of claim 48 wherein:

the semiconductor layer comprises a surface; and the optical signal path comprises, a first section having first and second regions and being disposed in a plane that is substantially parallel to the surface, a second section that is substantially perpendicular to the surface and that is disposed between the first region of the first section and a first one of the at least two portions of the memory device, and a third section that is substantially perpendicular to the surface and that is disposed between the second region of the first section and a second one of the at least two portions of the memory device.

50. The electronic system of claim 48 wherein:

the semiconductor layer comprises a surface; and the path comprises, an optical conductor that is disposed in a plane that is substantially parallel to the surface and that has first and second regions, an optical-to-electrical converter that is disposed in optical communication with the first region of the optical conductor, an electrical-to-optical converter that is disposed in optical communication with the second region of the first section, a first electrical conductor that is substantially perpendicular to the surface and that is disposed between the optical-to-electrical converter and a first one of the at least two portions of the memory device, and a second electrical conductor that is substantially perpendicular to the surface and that is disposed between the electrical-to-optical converter and a second one of the at least two portions of the memory device.

51. An electronic system, comprising:

a data input device;

a data output device; and computing circuitry coupled to the data input and output devices, the computing circuitry including a memory device that includes, a substrate, a semiconductor layer disposed on the substrate, one or more other layers disposed on the semiconductor layer, address, data, and command busses disposed in one of the other or semiconductor layers, an array of memory cells arranged in rows and columns and disposed in the semiconductor layer, an address decoder disposed in the semiconductor layer and coupled to the address bus and to the array, a read/write circuit disposed in the semiconductor layer and coupled to the address decoder and to the array, a data input/output circuit disposed in the semiconductor layer and coupled to the data bus and to said read/write circuit, a control circuit disposed in the semiconductor layer and coupled to the command bus, to the address decoder, to the read/write circuit, and to the data input/output circuit, an optical path disposed in the substrate underlying the semiconductor layer, the optical path having first and second path regions, the optical path operable to carry an optical signal from the first path region to the second path region;

a first optical coupler disposed in optical communication with the first path region and operable to direct the optical signal to the second region from one of the following: the address bus, command bus, data bus, array, address decoder, read/write circuit, data input/output circuit, and control circuit, and a second optical coupler disposed in optical communication with the second path region and operable to direct the optical signal from the first optical coupler to another one of the following: the address bus, command bus, data bus, array, address decoder, read/write circuit, data input/output circuit, and control circuit.

52. A method, comprising:

forming a trench in a semiconductor substrate;

forming an optically transmissive path within the trench by:
　lining the trench with a first optically transmissive material;
　filling the lined trench with a second optically transmissive material;
　recessing the second optically transmissive material; and
　capping the recessed second optically transmissive material with the first optically transmissive material;

forming a photo diode in a first region of the trench;

forming a light-emitting diode in a second region of the trench;

forming a semiconductor layer on the substrate;

forming first and second circuits in the semiconductor layer;

electrically coupling the first circuit to the photo diode; and electrically coupling the second circuit to the light-emitting diode.

53. A method, comprising:

forming a trench in a semiconductor substrate;

forming an optically transmissive path within the trench by:
　lining the trench with a reflective material;
　filling the lined trench with a first optically transmissive material,
　after filling the lined trench, filling the trench with a second optically transmissive material,
　recessing the second optically transmissive material, and
　capping the recessed second optically transmissive material with the first optically transmissive material;

forming a photo diode in a first region of the trench;

forming a light-emitting diode in a second region of the trench;

forming a semiconductor layer on the substrate;

forming first and second circuits in the semiconductor layer;

electrically coupling the first circuit to the photo diode; and electrically coupling the second circuit to the light-emitting diode.

54. A method, comprising:

forming a trench in a semiconductor substrate;

forming an optically transmissive path within the trench by:
　lining the trench with a refractory metal;
　filling the lined trench with a first optically transmissive material,
　after filling the lined trench, filling the trench with a second optically transmissive material,
　recessing the second optically transmissive material, and
　capping the recessed second optically transmissive material with the first optically transmissive material;

forming a photo diode in a first region of the trench;

forming a light-emitting diode in a second region of the trench;

forming a semiconductor layer on the substrate;

forming first and second circuits in the semiconductor layer;

electrically coupling the first circuit to the photo diode; and electrically coupling the second circuit to the light-emitting diode.

55. A method, comprising:

forming a trench in a silicon semiconductor substrate;

forming an optically transmissive path within the trench;

forming a photo diode in a first region of the trench, the photo diode being formed by:
　exposing the substrate in a region of the trench,
　growing epitaxial silicon in the region, and
　doping the epitaxial silicon;

forming a light-emitting diode in a second region of the trench, the light-emitting diode being formed by:
　exposing the substrate in a region of the trench,
　growing epitaxial silicon in the region, and
　doping the epitaxial silicon;

forming a semiconductor layer on the substrate;

forming first and second circuits in the semiconductor layer;

electrically coupling the first circuit to the photo diode; and electrically coupling the second circuit to the light-emitting diode.

56. The method of claim 52 wherein:

the substrate comprises silicon; and the forming a semiconductor layer comprises growing a layer of epitaxial silicon on the substrate.

57. A method, comprising:

forming a trench in a silicon semiconductor substrate;

forming an optically transmissive path within the trench;

forming a photo diode in a first region of the trench;

forming a light-emitting diode in a second region of the trench;

forming a semiconductor layer on the substrate by:
　recessing portions of the substrate,
　filling the recessed portions with an insulator,
　growing a layer of epitaxial silicon on the insulator and on exposed portions of the substrate;

forming first and second circuits in the semiconductor layer;

electrically coupling the first circuit to the photo diode; and electrically coupling the second circuit to the light-emitting diode.

58. The method of claim 52 wherein the electrically coupling the first circuit to the photo diode and the electrically coupling the second circuit to the light-emitting diode each respectively comprise:

forming in the semiconductor layer an opening that exposes the respective diode; and filling the opening with an electrically conductive material.

59. A method, comprising:

forming a trench in a semiconductor substrate;

forming isolation regions in the semiconductor layer;

forming an optically transmissive path within the trench;

forming a photo diode in a first region of the trench;

forming a light-emitting diode in a second region of the trench;

forming a semiconductor layer on the substrate;

forming first and second circuits in the semiconductor layer;

electrically coupling the first circuit to the photo diode by:
 forming in a respective one of the isolation regions an opening that exposes the respective diode; and
 filling the opening with an electrically conductive material; electrically coupling the second circuit to the light-emitting diode by:
 forming in a respective one of the isolation regions an opening that exposes the respective diode; and
 filling the opening with an electrically conductive material.

60. A method, comprising:

forming a trench in a silicon semiconductor substrate;

forming an optically transmissive path within the trench;

forming a photo diode in a first region of the trench;

forming a light-emitting diode in a second region of the trench;

forming a semiconductor layer on the substrate by:
 recessing portions of the substrate,
 filling the recessed portions with an insulator, and
 growing a layer of epitaxial silicon on the insulator and on exposed portions of the substrate;

forming first and second circuits in the semiconductor layer by forming the first and second circuits in substantial alignment with respective ones of the insulator-filled recessed portions of the substrate;

electrically coupling the first circuit to the photo diode; and electrically coupling the second circuit to the light-emitting diode.

61. A method, comprising:

forming in a substrate a trench having first and second end walls that are angled at approximately 45° with respect to the trench;

forming an optical waveguide in the trench;

forming a semiconductor layer on the substrate;

forming in the semiconductor layer a first circuit that is aligned with the first end wall at substantially a right angle with respect to the trench; and forming in the semiconductor layer a second circuit that is aligned with the second end wall at substantially a right angle with respect to the trench.

62. The method of claim 61 wherein the forming a trench comprises:

etching the substrate to form the trench; and exposing the trench to an orientation-dependent etch to form the angled sidewalls.

63. The method of claim 61 wherein the forming an optical waveguide comprises:

lining the trench with a first optically transmissive material;

partially filling the lined trench with a second optically transmissive material; and filling the partially filled trench with the first optically transmissive material.

64. The method of claim 61 wherein the forming an optical waveguide comprises:

lining the trench with a cladding material;

filling the lined trench with a core material;

recessing the core material; and filling the recess in the trench with the cladding material.

65. The method of claim 61 wherein the forming a semiconductor layer comprises:

forming an insulator layer on the substrate;

exposing regions of the substrate through the insulator layer; and using the exposed regions as seed areas to grow an epitaxial layer on the insulator layer.

66. The method of claim 61 wherein:

the forming a first circuit comprises forming a first diode having a junction that is aligned with the first end wall at substantially a right angle with respect to the trench; and the forming a second circuit comprises forming a second diode having a junction that is aligned with the second end wall at substantially a right angle with respect to the trench.

67. The method of claim 61, further comprising forming an optically transmissive layer on the substrate over the first and second end walls before forming the semiconductor layer.

68. The semiconductor structure of claim 6, further comprising:

an optical receiver disposed in the first region of the first optical path;

an optical transmitter disposed in the second region of the first optical path;

wherein the first signal path comprises a first conductor that couples the first circuit portion to the optical receiver; and wherein the second signal path comprises a second conductor that couples the second circuit portion to the optical transmitter.

69. The semiconductor structure of claim 6, further comprising:

a first reflector disposed in the first region of the first optical path;

a second reflector disposed in the second region of the first optical path;

a an optical receiver disposed in the first circuit portion;

an optical transmitter disposed in the second circuit portion;

wherein the first signal path comprises a second optical path that couples the first reflector to the optical receiver; and wherein the second signal path comprises a third optical path that couples the second reflector to the optical transmitter.

70. The semiconductor structure of claim 6 wherein:

the first region of the first optical path comprises a first end region of the first optical path; and the second region of the first optical path comprises a second end region of the first optical path.

71. The method of claim 53 wherein:

the substrate comprises silicon; and the forming a semiconductor layer comprises growing a layer of epitaxial silicon on the substrate.

72. The method of claim 53 wherein the electrically coupling the first circuit to the photo diode and the electrically coupling the second circuit to the light-emitting diode each respectively comprise:

forming in the semiconductor layer an opening that exposes the respective diode; and filling the opening with an electrically conductive material.

73. The method of claim 54 wherein:

the substrate comprises silicon; and the forming a semiconductor layer comprises growing a layer of epitaxial silicon on the substrate.

74. The method of claim 54 wherein the electrically coupling the first circuit to the photo diode and the electrically coupling the second circuit to the light-emitting diode each respectively comprise:

forming in the semiconductor layer an opening that exposes the respective diode; and filling the opening with an electrically conductive material.

75. The method of claim 55 wherein the forming a semiconductor layer comprises growing a layer of epitaxial silicon on the substrate.

76. The method of claim 55 wherein the electrically coupling the first circuit to the photo diode and the electrically coupling the second circuit to the light-emitting diode each respectively comprise:

forming in the semiconductor layer an opening that exposes the respective diode; and filling the opening with an electrically conductive material.

77. The method of claim 57 wherein the electrically coupling the first circuit to the photo diode and the electrically coupling the second circuit to the light-emitting diode each respectively comprise:

forming in the semiconductor layer an opening that exposes the respective diode; and filling the opening with an electrically conductive material.

78. The method of claim 59 wherein:

the substrate comprises silicon; and the forming a semiconductor layer comprises growing a layer of epitaxial silicon on the substrate.

79. The method of claim 60 wherein: the electrically coupling the first circuit to the photo diode and the electrically coupling the second circuit to the light-emitting diode each respectively comprise:

forming in the semiconductor layer an opening that exposes the respective diode; and filling the opening with an electrically conductive material.

* * * * *

UNITED STATES PATENT AND TRADEMARK OFFICE
CERTIFICATE OF CORRECTION

PATENT NO. : 5,987,196
DATED : November 16, 1999
INVENTOR(S) : Wendell P. Noble

It is certified that error appears in the above-identified patent and that said Letters Patent is hereby corrected as shown below:

Column 1, Line 41     "enough overcome"   -- enough to overcome --

Signed and Sealed this

Fifteenth Day of May, 2001

Attest:

NICHOLAS P. GODICI

Attesting Officer          Acting Director of the United States Patent and Trademark Office